United States Patent
Li et al.

(10) Patent No.: US 12,119,615 B1
(45) Date of Patent: Oct. 15, 2024

(54) SEMICONDUCTOR LASERS WITH SUBSTRATE MODE SUPPRESSION LAYERS

(71) Applicant: ANHUI GAN SEMICONDUCTOR CO., LTD., Anhui (CN)

(72) Inventors: Shuiqing Li, Lu'an (CN); Hongzhu Kan, Lu'an (CN); Jinjian Zheng, Lu'an (CN); Xinghe Wang, Lu'an (CN); Xin Cai, Lu'an (CN); Wanjun Chen, Lu'an (CN); Jiangyong Zhang, Lu'an (CN); Jun Huang, Lu'an (CN); Zihan Liu, Lu'an (CN)

(73) Assignee: ANHUI GAN SEMICONDUCTOR CO., LTD., Lu'an (CN)

( * ) Notice: Subject to any disclaimer, the term of this patent is extended or adjusted under 35 U.S.C. 154(b) by 0 days.

(21) Appl. No.: 18/638,654

(22) Filed: Apr. 17, 2024

Related U.S. Application Data

(63) Continuation of application No. PCT/CN2024/081590, filed on Mar. 14, 2024.

(30) Foreign Application Priority Data

Mar. 29, 2023 (CN) .......................... 202310319924.7

(51) Int. Cl.
*H01S 5/183* (2006.01)
*H01S 5/065* (2006.01)
*H01S 5/343* (2006.01)

(52) U.S. Cl.
CPC ........ *H01S 5/0653* (2013.01); *H01S 5/34346* (2013.01); *H01S 5/183* (2013.01)

(58) Field of Classification Search
CPC ....................................................... H01S 5/183
See application file for complete search history.

(56) References Cited

U.S. PATENT DOCUMENTS

2002/0014674 A1 2/2002 Hideyoshi et al.
2009/0219967 A1 9/2009 Hashimoto
(Continued)

FOREIGN PATENT DOCUMENTS

CN 104953467 A 9/2015
CN 105281201 A 1/2016
(Continued)

OTHER PUBLICATIONS

First Office Action in Chinese Application No. 202310319924.7 mailed on Aug. 10, 2023, 11 pages.
(Continued)

*Primary Examiner* — Minsun O Harvey
*Assistant Examiner* — Stephen Sutton Kotter
(74) *Attorney, Agent, or Firm* — PORUS IP LLC

(57) ABSTRACT

Disclosed is a semiconductor laser with a substrate mode suppression layer, comprising a substrate, a first limiting layer, a first waveguide layer, an active layer, a second waveguide layer, an electron blocking layer, and a second limiting layer sequentially stacked from bottom to top. A Si/C concentration ratio of an element Si to an element C of the substrate mode suppression layer≥that of the first sub-limiting layer≥that of the second sub-limiting layer. An In/Al concentration ratio of an element In to an element Al of the substrate mode suppression layer≥that of the first sub-limiting layer≥that of the second sub-limiting layer. An H/C concentration ratio of an element H to an element C of the substrate mode suppression layer≥that of the second sub-limiting layer≥that of the first sub-limiting layer.

9 Claims, 3 Drawing Sheets

(56) References Cited

U.S. PATENT DOCUMENTS

2011/0026555 A1* 2/2011 Takeuchi ............... B82Y 20/00
                                                 372/45.011
2016/0020581 A1* 1/2016 Hirose ................ H01S 3/08009
                                                  372/46.01
2017/0250519 A1* 8/2017 Kuraoka ............. H01L 21/2015

FOREIGN PATENT DOCUMENTS

CN         116169558 A    5/2023
EP           1873879 A1   1/2008

OTHER PUBLICATIONS

Notification to Grant Patent Right for Invention in Chinese Application No. 202310319924.7 mailed on Nov. 20, 2023, 4 pages.
Jiang, Lingrong et al., Suppression of substrate mode in GaN-based green laser diodes, Optics Express,28(10): 15497-15504, 2020.

* cited by examiner

SEMICONDUCTOR LASERS WITH SUBSTRATE MODE SUPPRESSION LAYERS

CROSS-REFERENCE TO RELATED APPLICATIONS

This application is a Continuation of International Application No. PCT/CN2024/081590, filed on Mar. 14, 2024, which claims priority to Chinese Patent Application No. 202310319924.7, filed on Mar. 29, 2023, the entire contents of which are hereby incorporated by reference.

TECHNICAL FIELD

The present disclosure relates to the technical field of semiconductor optoelectronic devices, and in particular to a semiconductor laser with a substrate mode suppression layer.

BACKGROUND

A laser device is widely used in the fields of laser display, laser TVs, laser projectors, communication, medical, weapons, guidance, ranging, spectral analysis, cutting, precision welding, high-density optical storage, or the like. There are many types of laser devices classified in various ways, mainly including solid, gas, liquid, semiconductor, and dye types of laser devices. Compared with other types of laser devices, an all-solid-state semiconductor laser device (e.g., a nitride semiconductor light-emitting diode (LED)) has the advantages of small size, high efficiency, light weight, good stability, long service life, simple and compact structure, miniaturization, etc.

Major differences between the conventional laser and the nitride semiconductor LED (hereinafter referred to as a semiconductor laser) are illustrated as follows.

(1) A laser of the conventional laser is generated by carriers undergoing excited radiation, a spectral full width at half maximum (FWHM) is small, a brightness is very high, and an output power of a single laser may be in a W level. However, light of the semiconductor laser is generated by spontaneous radiation, and an output power of a single semiconductor laser is in an mW level.

(2) A usage current density of the conventional laser reaches $KA/cm^2$, which is two orders of magnitude higher than that of the semiconductor laser, thus causing stronger electron leakage, more severe Auger recombination, a stronger polarization effect, and a more severe electron-hole mismatch, which leads to a more severe Droop effect in efficiency.

(3) The semiconductor laser has spontaneous transition radiation from high-energy-level incoherent light to low-energy-level incoherent light without external action. However, the conventional laser is implemented by excited transition radiation, the induced photon energy is equal to a difference between the energy levels of the electron transition, resulting in identical coherent light of photons and induced photons.

(4) The principle is different. The semiconductor laser is that under the action of an external voltage, electron holes jump to an active layer or a p-n junction to produce radiative recombination light. However, the conventional laser needs to meet the condition of excitation of an inversion distribution in an active region carrier before being excited. The excited radiation light oscillates back and forth in a resonant cavity to realize light amplification by propagating in a gain medium, so that a threshold condition is met, the gain is greater than the loss, and the laser light is ultimately output.

However, the existing semiconductor laser has the following problems.

(1) An absorption loss of an optical waveguide is high.

(2) As refractive index dispersion of the semiconductor laser, a limiting factor decreases with an increasing wavelength, leading to a decrease in a mode gain of the semiconductor laser.

(3) A thickness of a lower limiting layer (also referred to as a first limiting layer) may be increased, which may reduce a refractive index of the limiting layer. However, the increased thickness of the lower limiting layer may limit regulating ranges of elements, which is prone to cracking, bending, quality degradation, or other problems. In addition, optical field modes may lead to a substrate to form standing waves, causing low suppression efficiency of substrate modes.

Therefore, it is desirable to provide a semiconductor laser with a substrate mode suppression layer, which is capable of preventing the optical field modes from leading to the substrate to form the standing waves.

SUMMARY

One of the embodiments of the present disclosure provides a semiconductor laser with a substrate mode suppression layer. The semiconductor laser may comprise a substrate, a first limiting layer, a first waveguide layer, an active layer, a second waveguide layer, an electron blocking layer, and a second limiting layer sequentially stacked from bottom to top. The first limiting layer may include a first sub-limiting layer, the substrate mode suppression layer, and a second sub-limiting layer sequentially stacked from bottom to top. A Si/C concentration ratio of an element Si to an element C of the substrate mode suppression layer may be greater than or equal to a Si/C concentration ratio of an element Si to an element C of the first sub-limiting layer. The Si/C concentration ratio of the element Si to the element C of the first sub-limiting layer may be greater than or equal to a Si/C concentration ratio of an element Si to an element C of the second sub-limiting layer. An In/Al concentration ratio of an element In to an element Al of the substrate mode suppression layer may be greater than or equal to an In/Al concentration ratio of an element In to an element Al of the first sub-limiting layer. The In/Al concentration ratio of the element In to the element Al of the first sub-limiting layer may be greater than or equal to an In/Al concentration ratio of an element In to an element Al of the second sub-limiting layer. An H/C concentration ratio of an element H to an element C of the substrate mode suppression layer may be greater than or equal to an H/C concentration ratio of an element H to an element C of the second sub-limiting layer. The H/C concentration ratio of the element H to the element C of the second sub-limiting layer may be greater than or equal to an H/C concentration ratio of an element H to an element C of the first sub-limiting layer.

In some embodiments, at least one substrate mode suppression layer may be provided between the first sub-limiting layer and the second sub-limiting layer.

In some embodiments, the Si/C concentration ratio of the element Si to the element C of the substrate mode suppression layer may be within a range of 200-8000.

In some embodiments, the Si/C concentration ratio of the element Si to the element C of the first sub-limiting layer may be within a range of 80-200.

In some embodiments, the Si/C concentration ratio of the element Si to the element C of the second sub-limiting layer may be within a range of 5-80.

In some embodiments, a maximum value of a range of the In/Al concentration ratio of the element In to the element Al of the substrate mode suppression layer may be more than $10^5$ times a minimum value of a range of the In/Al concentration ratio of the element In to the element Al of the first sub-limiting layer.

In some embodiments, a maximum value of a range of the In/Al concentration ratio of the element In to the element Al of the substrate mode suppression layer may be more than $10^5$ times a minimum value of a range of the In/Al concentration ratio of the element In to the element Al of the second sub-limiting layer.

In some embodiments, a material of the first sub-limiting layer and a material of the second sub-limiting layer may include AlGaN. A thickness of the first sub-limiting layer and a thickness of the second sub-limiting layer may be within a range of 10-90000 Å. A material of the substrate mode suppression layer may include any one of AlInGaN, InGaN, AlInN, and AlGaN, or any combination thereof. A thickness of the substrate mode suppression layer may be within a range of 10-90000 Å.

In some embodiments, the active layer may include a periodic structure consisting of well layers and barrier layers. A period m of the periodic structure may be within a range of 1≤m≤3. A material of each of the well layers of the active layer may include any one of GaN, InGaN, InN, AlInN, AlInGaN, and AlGaN, or any combination thereof. A thickness p of each of the well layers of the active layer may be within a range of 5≤p≤100 Å. A material of each of the barrier layers of the active layer may include any one of GaN, InGaN, InN, AlInN, AlInGaN, and AlN, or any combination thereof. A thickness q of each of the barrier layers of the active layer may be within a range of 10≤q≤200 Å. A thickness x of the first waveguide layer may be within a range of 10≤x≤9000 Å. A thickness y of the second waveguide layer may be within a range of 10≤y≤9000 Å. A thickness I of the second limiting layer may be within a range of 10≤I≤80000 Å. A thickness n of the electron blocking layer may be within a range of 10≤n≤80000 Å.

In some embodiments, a material of the first waveguide layer, a material of the second waveguide layer, a material of the electron blocking layer, and a material of the second limiting layer may include any one of GaN, AlGaN, InGaN, AlInGaN, AlN, InN, AlInN, SiC, $Ga_2O_3$, BN, GaAs, GaP, InP, AlGaAs, AlInGaAs, AlGaInP, InGaAs, AlInAs, AlInP, AlGaP, and InGaP, or any combination thereof. A material of the substrate may include any one of a sapphire, Si, Ge, SiC, AlN, GaN, GaAs, InP, a sapphire/$SiO_2$ composite substrate, a sapphire/AlN composite substrate, sapphire/SiNx, magnesium aluminum spinel $MgAl_2O_4$, MgO, ZnO, $ZrB_2$, $LiAlO_2$, and a $LiGaO_2$ composite substrate, or any combination thereof.

BRIEF DESCRIPTION OF THE DRAWINGS

The present disclosure will be further illustrated by way of exemplary embodiments, which will be described in detail by means of the accompanying drawings. These embodiments are not limiting. In these embodiments, the same numbering indicates the same structure, wherein.

Figure 1:
FIG. 1 is a schematic structural diagram illustrating a semiconductor laser with a substrate mode suppression layer according to some embodiments of the present disclosure.

Reference signs: 100: substrate, 101: first limiting layer, 102: first waveguide layer, 103: active layer, 104: second waveguide layer, 105: electron blocking layer, 106: second limiting layer; 101a: first sub-limiting layer, 101b: substrate mode suppression layer, 101c: second sub-limiting layer.

DETAILED DESCRIPTION

In order to more clearly illustrate the technical solutions of the embodiments of the present disclosure, the following briefly introduces the drawings that need to be used in the description of the embodiments. Apparently, the accompanying drawings in the following description are only some examples or embodiments of the present disclosure, and those skilled in the art can also apply the present disclosure to other similar scenarios according to the drawings without creative efforts. Unless obviously obtained from the context or the context illustrates otherwise, the same numeral in the drawings refers to the same structure or operation.

It should be understood that "system", "device", "unit" and/or "module" as used herein is a method for distinguishing different components, elements, parts, portions or assemblies of different levels. However, the words may be replaced by other expressions if other words can achieve the same purpose.

As indicated in the disclosure and claims, the terms "a", "an", and/or "the" are not specific to the singular form and may include the plural form unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

The flowchart is used in the present disclosure to illustrate the operations performed by the system according to the embodiments of the present disclosure. It should be understood that the preceding or following operations are not necessarily performed in the exact order. Instead, various steps may be processed in reverse order or simultaneously. Meanwhile, other operations may be added to these procedures, or a certain step or steps may be removed from these procedures.

Laser light may be emitted by using a semiconductor laser in the prior art. The semiconductor laser may include one of an electron type semiconductor, a quantum well, an electron blocking layer, and a hole type semiconductor, or any combination thereof. In order to maintain a mode gain of the semiconductor laser, it is desirable to increase a thickness of a lower limiting layer (also referred to as a first limiting layer) of the semiconductor laser to reduce a refractive index of the limiting layer. However, the requirement for the thickness of the first limiting layer of the semiconductor laser may limit regulating ranges of elements, which is prone to cracking, bending, quality degradation, or other problems. In addition, optical field modes may lead to a substrate to form standing waves, causing low suppression efficiency of substrate modes.

The present disclosure provides a semiconductor laser with a substrate mode suppression layer. According to the semiconductor laser, the substrate mode suppression layer may be provided in the first limiting layer, and an Si/C concentration ratio, an In/Al concentration ratio, and an H/C concentration ratio of the substrate mode suppression layer may be regulated, so that lobes in a far-field distribution image of the semiconductor laser can be eliminated, high kinking can be prevented by threshold suppression, and the substrate modes can be suppressed, thereby resolving the problem that the optical field modes lead to the substrate to form the standing waves, and making main laser beams output from the semiconductor laser free of ripples. More descriptions regarding the modes of the semiconductor laser may be found in FIG. 1 and related descriptions thereof.

It should be understood that the application scenarios of the semiconductor laser in the present disclosure are only some examples or embodiments, and that a person having ordinary skills in the art may, without creative labor, apply the present disclosure to other similar scenarios in accordance with these accompanying drawings.

The semiconductor laser provided in the embodiments of the present disclosure will be described in detail below with reference to FIGS. 1-3. It should be noted that the following embodiments are only for explaining the present disclosure and do not constitute a limitation to the present disclosure.

FIG. 1 is a schematic structural diagram illustrating a semiconductor laser with a substrate mode suppression layer according to some embodiments of the present disclosure. In some embodiments, as illustrated in FIG. 1, the semiconductor laser may comprise a substrate 100, a first limiting layer 101, a first waveguide layer 102, an active layer 103, a second waveguide layer 104, an electron blocking layer 105, and a second limiting layer 106 sequentially stacked from bottom to top.

The substrate 100 refers to a component configured to support other components in the semiconductor laser, such as the first limiting layer 101, the first waveguide layer 102, or the like.

A limiting layer refers to a thin layer structure configured to limit injection of carriers. In some embodiments, the limiting layer may include N-type and P-type distributed Bragg Reflectors (DBR) to fulfill a function of a resonator reflector. For example, the limiting layer may control current to be injected into the active layer 103 through the resonator reflector. In some embodiments, the limiting layer may include the first limiting layer 101 and the second limiting layer 106.

The first limiting layer 101 is also referred to as a lower limiting layer. In some embodiments, the first limiting layer 101 may be provided on the substrate 100 to control the current supplied by an electrode to be injected into the active layer 103, thereby increasing a laser output power of the semiconductor laser, reducing a threshold current, and ensuring single-mode output. In some embodiments, the first limiting layer 101 may also act as a total reflector to reflect all laser light, so that all the laser light may be emitted from the second limiting layer 106.

The second limiting layer 106 is also referred to as an upper limiting layer. In some embodiments, the second limiting layer 106 may be superimposed on the active layer 103 to control the current supplied by the electrode to be injected into the active layer 103, and act as a partial reflector to control laser light to be emitted from the second limiting layer 106. For example, the second limiting layer 106 may control the laser light to be emitted vertically from a surface of the second limiting layer 106. More descriptions regarding the active layer 103 may be found in related descriptions below.

In some embodiments, as illustrated in FIG. 1, the first limiting layer 101 may include a first sub-limiting layer 101a, a substrate mode suppression layer 101b, and a second sub-limiting layer 101c sequentially stacked from bottom to top.

Merely by way of example, the first sub-limiting layer 101a may control the current by the electrode to be injected into the active layer 103. The second sub-limiting layer 102c may act as the total reflector to reflect the laser light completely, so as to make all the laser light be emitted from the second limiting layer 106.

A mode of the semiconductor laser refers to a stable distribution of a light field in a resonant cavity of the semiconductor laser. The substrate mode suppression layer 101b refers to a thin layer structure configured to suppress a gain of a substrate mode. In some embodiments, the substrate mode suppression layer 101b may suppress an optical field mode leading to the substrate due to an increase in a thickness of the first limiting layer 101, i.e., the substrate mode suppression layer 101b may suppress the substrate mode to prevent the laser light from leading to the substrate to form standing waves.

In some embodiments, the function of suppressing the substrate mode may be realized by regulating an element concentration ratio of the substrate mode suppression layer 101b. The element concentration ratio may include one of an Si/C concentration ratio of an element Si to an element C, an In/Al concentration ratio of an element In to an element Al, an H/C concentration ratio of an element H to an element C, or the like, or any combination thereof.

In some embodiments, the element concentration ratio of the substrate mode suppression layer 101b may be related to an element concentration ratio of the first sub-limiting layer 101a and an element concentration ratio of the second sub-limiting layer 101c.

In some embodiments, the Si/C concentration ratio of the element Si to the element C of the substrate mode suppression layer 101b may be greater than or equal to an Si/C concentration ratio of an element Si to an element C of the first sub-limiting layer 101a. The Si/C concentration ratio of the element Si to the element C of the first sub-limiting layer 101a may be greater than or equal to a Si/C concentration ratio of an element Si to an element C of the second sub-limiting layer 101c. In some embodiments, an In/Al concentration ratio of an element In to an element Al of the substrate mode suppression layer 101b may be greater than or equal to an In/Al concentration ratio of an element In to an element Al of the first sub-limiting layer 101a. The In/Al concentration ratio of the element In to the element Al of the first sub-limiting layer 101a may be greater than or equal to an In/Al concentration ratio of an element In to an element Al of the second sub-limiting layer 101c. In some embodiments, an H/C concentration ratio of an element H to an element C of the substrate mode suppression layer 101b may be greater than or equal to an H/C concentration ratio of an element H to an element C of the second sub-limiting layer 101c. The H/C concentration ratio of the element H to the element C of the second sub-limiting layer 101c may be greater than or equal to an H/C concentration ratio of an element H to an element C of the first sub-limiting layer 101a.

Figure 2:
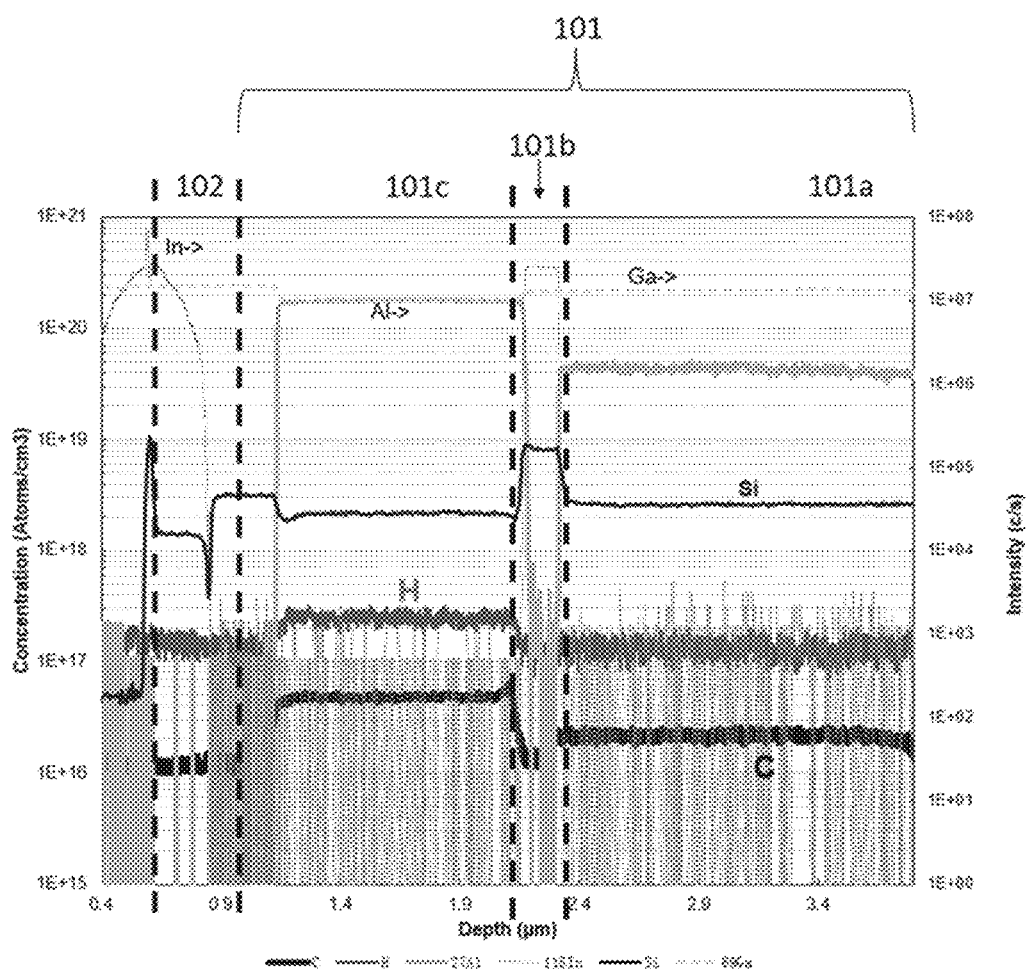
FIG. 2 is a secondary ion mass spectroscopy (SIMS) illustrating a semiconductor laser with a substrate mode suppression layer according to some embodiments of the present disclosure.

FIG. 2 is an SIMS illustrating a semiconductor laser with a substrate mode suppression layer according to some embodiments of the present disclosure. As illustrated in FIG. 2, an Si/C concentration ratio of an element Si to an element C of the substrate mode suppression layer 101b≥an Si/C concentration ratio of an element Si to an element C of the first sub-limiting layer 101a≥an Si/C concentration ratio of an element Si to an element C of the second sub-limiting layer 101c, thereby forming a Si/C concentration ratio gradient. An In/Al concentration ratio of an element In to an element Al of the substrate mode suppression layer 101b≥an In/Al concentration ratio of an element In to an element Al of the first sub-limiting layer 101a≥an In/Al concentration ratio of an element In to an element Al of the second sub-limiting layer 101c, thereby forming an In/Al concentration ratio gradient. An H/C concentration ratio of an element H to an element C of the substrate mode suppression layer 101b≥ an H/C concentration ratio of an element H to an element C of the second sub-limiting layer 101c≥an H/C concentration ratio of an element H to an element C of the first sub-limiting layer 101a, thereby forming an H/C concentration ratio gradient.

In some embodiment of the present disclosure, by regulating the Si/C concentration ratio of the element Si to the element C, the In/Al concentration ratio of the element In to the element Al, and the H/C concentration ratio of the element H to the element C of the substrate mode suppression layer 101b, and the Si/C concentration ratio gradient, the In/Al concentration ratio gradient, and the H/C concentration ratio gradient of the substrate mode suppression layer 101b and the first sub-limiting layer 101a and the second sub-limiting layer 101c, the substrate 100 mode may be suppressed, lobes in a far-field distribution image of the semiconductor laser may be eliminated, and high kinking may be prevented, making main laser beams free of ripples, thereby improving the quality of laser light output from the semiconductor laser.

TABLE 1

Comparison of performance of a conventional laser and a semiconductor laser provided in the embodiments of the present disclosure

|  | Conventional laser | Semiconductor laser in the embodiments | Magnitude of change |
|---|---|---|---|
| Beam quality factor M2 | 3.7 | 2.3 | 61% |
| Internal optical loss (cm$^{-1}$) | 18.2 | 12.1 | −34% |
| Slope efficiency (W/A) | 1.25 | 1.75 | 40% |
| Optical power (W) | 3.5 | 4.9 | 40% |
| External quantum efficiency | 28.50% | 39.50% | 39% |

Table 1 is a table illustrating comparison of the performance of the conventional laser and the semiconductor laser provided in the embodiments of the present disclosure. As illustrated in Table 1, compared with the conventional laser, a beam quality factor of the semiconductor laser provided in the embodiments of the present disclosure can be improved by 61%. In addition, an absorption loss of an optical waveguide is reduced, and an internal optical loss decreases from 18.2 cm 1 to 12.1 cm 1, a reduction of 34%, which improves refractive index dispersion of the semiconductor laser, and enhances the mode gain, the laser power, and the slope efficiency of the semiconductor laser. The slope efficiency increases from 1.25 W/A to 1.75 W/A, an increase of 40%. The laser power increases from 3.5 W to 4.9 W, an increase of 40%. The external quantum efficiency increases from 28.5% to 39.5%, an increase of approximately 39%. More descriptions regarding the element concentration ratio may be found in FIG. 3 and related descriptions thereof.

A waveguide layer refers to a thin layer structure configured to guide propagation of an optical signal. In some embodiments, a material of the waveguide layer may include a high refractive index material, such as silicon dioxide, or silicon nitride, or the like. In some embodiments, the waveguide layer may control a transmission direction of laser light between the active layer 103 and the limiting layer, thereby limiting laser light diffusion, and improving the quality of the laser light output from the semiconductor laser. In some embodiments, the waveguide layer may include the first waveguide layer 102 and the second waveguide layer 104.

The first waveguide layer 102, also referred to as a lower waveguide layer, may be provided between the first limiting layer 101 and the active layer 103. In some embodiments, the first waveguide layer 102 may control laser light emitted from the active layer 103 to transmit to the first limiting layer 101, or control the laser light reflected from the first limiting layer 101 to transmit back to the active layer 103.

the second waveguide layer 104, also referred to as an upper waveguide layer, may be provided between the active layer 103 and the electron blocking layer 105. In some embodiments, the second waveguide layer 104 may control the laser light emitted from the active layer 103 to transmit to the electron blocking layer 105 emit the laser light through the second limiting layer 106. More descriptions regarding the electron blocking layer 105 may be found in related descriptions below.

The active layer 103 refers to a thin layer structure that is excited to radiate to achieve laser output. In some embodiments, the active layer 103 may receive current from an electrode. A semiconductor material inside the active layer 103 may be excited in an active region to transition between energy bands, thus outputting the laser light to realize laser output. An output direction of the laser may be perpendicular to a surface of the active layer 103.

In some embodiments, when the semiconductor laser operates, the semiconductor laser may receive the current from the electrode, and transmit the current to the active layer 103 through the first limiting layer 101 and the second limiting layer 106 to be excited to radiate in the active layer 103 to generate the laser light. In addition, the output direction of the laser light may be controlled through the first waveguide layer 102 and the second waveguide layer 104 to control, so that the output direction of the laser light may be perpendicular to the surface where the active layer 103 is located, and the laser light may be emitted through a surface of the second limiting layer 106, thereby achieving stable output of the laser light from the semiconductor laser.

In some embodiments, the active layer 103 may include a periodic structure composed of well layers and barrier layers. The periodic structure refers to a structure in which electrons periodically transition between the well layers and the barrier layers. The active layer 103 may be periodically arranged by alternating layers of the well layer and the barrier layer. Under the effect of an applied electric field, electrons in the active layer 103 may transition from a low energy band material (e.g., the barrier layers) to a high energy band material (e.g. the well layers) through periodic stacking of the well layers and the barrier layers, while releasing energy. The energy may be converted into photons to generate the laser light. A period m of the periodic structure refers to a duration of one transition of the electrons between the well layers and the barrier layers. In some embodiments, the period m of the periodic structure may be within a range of 1≤m≤3.

In some embodiments, a material of the well layers of the active layer 103 may include any one of GaN, InGaN, InN, AlInN, AlInGaN, and AlGaN, or any combination thereof. In some embodiments, a thickness p of each of the well layers of the active layer 103 may be within a range of 5≤p≤100 Å. For example, the thickness p of each of the well layers of the active layer 103 may be 5 Åm, 25 Åm, 50 Åm, and 80 Åm.

In some embodiments, a material of the barrier layers of the active layer 103 may include any one of GaN, InGaN, InN, AlInN, AlInGaN, and AlN, or any combination thereof. In some embodiments, a thickness q of each of the barrier layers of the active layer 103 may be within a range of 10≤q≤200 Å. For example, the thickness q of each of the barrier layers of the active layer 103 may be 10 Åm, 25 Åm, 70 Åm, 200 Åm.

In some embodiments, the first waveguide layer 102, the second waveguide layer 104, the second limiting layer 106, and the electron blocking layer 105 may be within corresponding preset thickness ranges, respectively. The corresponding preset thickness ranges may be determined in various ways, such as manual experience or historical semiconductor laser data.

In some embodiments, a thickness x of the first waveguide layer 102 may be within a range of 10≤x≤9000 Å. For example, the thickness x of the first waveguide layer 102 may be 10 Å, 500 Å, 1000 Å, and 9000 Å.

In some embodiments, a thickness y of the second waveguide layer 104 may be within a range of 10≤y≤9000 Å. For example, the thickness y of the second waveguide layer 104 may be 10 Å, 600 Å, 2000 Å, and 9000 Å.

In some embodiments, a thickness I of the second limiting layer 106 may be within a range of 10≤I≤80000 Å. For example, the thickness I of the second limiting layer 106 may be 10 Å, 1000 Å, 5000 Å, and 80000 Å.

In some embodiments, a thickness n of the electron blocking layer 105 may be within a range of 10≤n≤80000 Å. For example, the thickness n of the electron blocking layer 105 may be 10 Å, 5000 Å, 10000 Å, and 80000 Å.

In the embodiments of the present disclosure, by designing the periodic structure of the active layer, the material and the thickness gradient of the well layers and the barrier layers in the active layer, and designing the thickness gradient of the first waveguide layer, the second waveguide layer, the second limiting layer, and the electron blocking layer, the refractive index dispersion of the semiconductor laser can be reduced, and a low limiting factor can be avoided, thereby increasing the mode gain of the semiconductor laser.

The electron blocking layer 105 refers to a thin layer structure configured to block entry of free electrons. In some embodiments, a material of the electron blocking layer 105 may include one or more dielectric materials, such as aluminum nitride, aluminum gallium nitride, gallium nitride, or the like. In some embodiments, the electron blocking layer 105 may be provided between the second waveguide layer 104 and the second limiting layer 106 to prevent moving electrons from leaving the active layer 103.

In the embodiments of the present disclosure, by regulating the element concentration ratio gradient of the substrate mode suppression layer 101b, the first sub-limiting layer 101a, and the second sub-limiting layer 101c, the substrate mode suppression layer 101b may suppress the substrate 100 mode, eliminate the lobes in the far-field distribution image of the semiconductor laser, prevent high kinking, and make the output main laser beams free of ripples, thereby improving the quality of the laser light output from the semiconductor laser.

In some embodiments, the substrate 100 may be made of a material that satisfies a preset substrate condition. The preset substrate condition may include that a lattice mismatch and a thermal mismatch of the material of the substrate 100 is less than or equal to a preset mismatch threshold. The lattice mismatch refers to a phenomenon that distances and angles between atoms in a crystal do not conform to the requirements of an ideal crystal. The thermal mismatch refers to a phenomenon of mismatch of the material due to differences in coefficients of thermal expansion when a temperature changes. The preset mismatch threshold may be determined based on the manual experience and the historical substrate material data.

That is to say, the substrate 100 may be made of a material with less lattice mismatch and thermal mismatch to reduce a defect density and a polarization effect of the semiconductor laser.

In some embodiments, the material of the substrate 100 may include any one of sapphire, silicon, Ge, SiC, AlN, GaN, GaAs, InP, a sapphire/$SiO_2$ composite substrate, a sapphire/AlN composite substrate, sapphire/SiNx, magnesium aluminum spinel $MgAl_2O_4$, MgO, ZnO, $ZrB_2$, $LiAlO_2$, and a $LiGaO_2$ composite substrate, or any combination thereof.

In some embodiments, materials of the first waveguide layer 102, the second waveguide layer 104, the electron blocking layer 105, and the second limiting layer 106 may be determined based on the manual experience and the historical material data of the semiconductor laser.

In some embodiments, the materials of the first waveguide layer 102, the second waveguide layer 104, the electron blocking layer 105, and the second limiting layer 106 may include any one of GaN, AlGaN, InGaN, AlInGaN, AlN, InN, AlInN, SiC, $Ga_2O_3$, BN, GaAs, GaP, InP, AlGaAs, AlInGaAs, AlGaInP, InGaAs, AlInAs, AlInP, AlGaP, and InGaP, or any combination thereof.

In some embodiment of the present disclosure, by designing the material of the substrate 100, and the materials of the first waveguide layer 102, the second waveguide layer 104, the electron blocking layer 105, and the second limiting layer 106, the defect density and the polarization effect of the semiconductor laser can be reduced, thereby improving the quality of the laser light output from the semiconductor laser.

Figure 3:
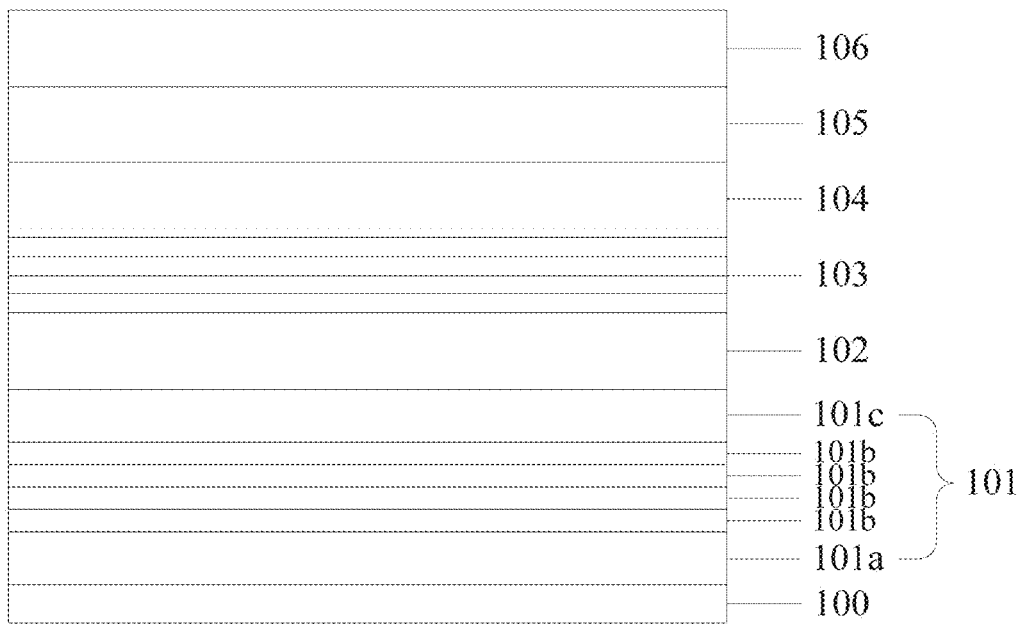
FIG. 3 is a schematic structure diagram illustrating a semiconductor laser with a substrate mode suppression layer according to some embodiments of the present disclosure.

FIG. 3 is a schematic structure diagram illustrating a semiconductor laser with a substrate mode suppression layer according to some embodiments of the present disclosure. In some embodiments, as illustrated in FIG. 3, at least one substrate mode suppression layer 101b may be provided between the first sub-limiting layer 101a and the second sub-limiting layer 101c.

In some embodiments, one substrate mode suppression layer 101b may be provided, and a plurality of substrate mode suppression layers 101b may also be provided. Suppression effects of the plurality of substrate mode suppression layers 101b may be stacked, so that the substrate 100 mode may be further suppressed, thereby preventing the optical field modes from leading to a substrate. In some embodiments, one substrate mode suppression layer 101b, two substrate mode suppression layers 101b, four substrate mode suppression layer 101b, or the like, may be provided. A count of the substrate mode suppression layer 101b may be determined in various ways, such as by manual experience or historical semiconductor data.

In the embodiments of the present disclosure, by providing at least one substrate mode suppression layer 101b in the first limiting layer 101, and regulating an Si/C concentration ratio of an element Si to an element C, an In/Al concentration ratio of an element In to an element Al, and an H/C concentration ratio of an element H to an element C of the substrate mode suppression layer 101b, lobes in a far-field distribution image of the semiconductor laser can be eliminated, high kinking can be prevented, the substrate 100 mode can be suppressed, and the optical field modes can be prevented from leading to the substrate 100 to form standing waves, making output main laser beams free of ripples, thereby improving the quality of laser light output from the semiconductor laser.

In some embodiments, the Si/C concentration ratio of the element Si to the element C of the substrate mode suppression layer 101b may be within a first range of concentration ratio. The first range of concentration ratio may be determined in various ways, such as by manual experience or historical Si/C concentration ratio data of the substrate mode suppression layer 101b.

In some embodiments, the Si/C concentration ratio of the element Si to the element C of the substrate mode suppression layer 101b may be within a range of 200-8000. For example, the Si/C concentration ratio of the element Si to the element C of the substrate mode suppression layer 101b may be 200, 500, 2000, or 8000.

In some embodiments, the Si/C concentration ratio of the element Si to the element C of the first sub-limiting layer 101a may be within a second range of concentration ratio. The second range of concentration ratio may be overall smaller than the first range of concentration ratio. The second range of concentration ratio may be determined in various ways, such as by manual experience or historical Si/C concentration ratio data of the first sub-limiting layer 101a.

In some embodiments, the Si/C concentration ratio of the element Si to the element C of the first sub-limiting layer 101a may be within a range of 80-200. For example, the Si/C concentration ratio of the element Si to the element C of the first sub-limiting layer 101a may be 80, 100, 150, or 200.

In some embodiments, the Si/C concentration ratio of the element Si to the element C of the second sub-limiting layer 101c may be within a third range of concentration ratio. The third range of concentration ratio may be overall smaller than the second range of concentration ratio. The third range of concentration ratio may be determined in various ways, such as by manual experience or historical Si/C concentration ratio data of the second sub-limiting layer 101c.

In some embodiments, the Si/C concentration ratio of the element Si to the element C of the second sub-limiting layer 101c may be within a range of 5-80. For example, the Si/C concentration ratio of the element Si to the element C of the second sub-limiting layer 101c may be 5, 15, 50, or 80.

In some embodiments, a range of the In/Al concentration ratio of the element In to the element Al of the substrate mode suppression layer 101b may be related to a range of the In/Al concentration ratio of the element In to the element Al of the first sub-limiting layer 101a. A maximum value of the range of the In/Al concentration ratio of the element In to the element Al of the substrate mode suppression layer 101b may be related to a first multiple of a minimum value of the range of the In/Al concentration ratio of the element In to the element Al of the first sub-limiting layer 101a. A relationship of the first multiple may be determined in various ways, such as by manual experience or historical In/Al concentration ratio data of the semiconductor laser.

In some embodiments, the maximum value of the range of the In/Al concentration ratio of the element In to the element Al of the substrate mode suppression layer 101b may be more than $10^5$ times the minimum value of the range of the In/Al concentration ratio of the element In to the element Al of the first sub-limiting layer 101a. Merely by way of example, the maximum value of the range of the In/Al concentration ratio of the element In to the element Al of the substrate mode suppression layer 101b may be $1*10^5$, $15*10^6$, $50*10^7$, or $80*10^5$. Correspondingly, the minimum values of the range of the In/Al concentration ratio of the element In to the element Al of the first sub-limiting layer 101a may be 1, 15, 50, or 80.

In some embodiments, the range of the In/Al concentration ratio of the element In to the element Al of the substrate mode suppression layer 101b may be related to the range of the In/Al concentration ratio of the element In to the element Al of the second sub-limiting layer 101c. The maximum value of the range of the In/Al concentration ratio of the element In to the element Al of the substrate mode suppression layer 101b may be related to a second multiple of a minimum value of the range of the In/Al concentration ratio of the element In to the element Al of the second sub-limiting layer 101c. A relationship of the second multiple may be determined in various ways, such as by manual experience or historical In/Al concentration ratio data of the semiconductor laser.

In some embodiments, the maximum value of the range of the In/Al concentration ratio of the element In to the element Al of the substrate mode suppression layer 101b may be more than $10^5$ times the minimum value of the range of the In/Al concentration ratio of the element In to the element Al of the second sub-limiting layer 101c. Merely by way of example, the maximum value of the range of the In/Al concentration ratio of the element In to the element Al of the substrate mode suppression layer 101b may be $1*10^6$, $20*10^6$, $70*10^7$, or $100*10^5$. Correspondingly, the minimum value of the range of the In/Al concentration ratio of the element In to the element Al of the second sub-limiting layer 101c may be 1, 20, 70, or 100.

In the embodiments of the present disclosure, by designing the range of the Si/C concentration ratio of the element Si to the element C and the range of the In/Al concentration ratio of the element In to the element Al of the first sub-limiting layer 101a, the substrate mode suppression layer 101b, and the second sub-limiting layer 101c, the coordination of the first sub-limiting layer 101a, the substrate mode suppression layer 101b, and the second sub-limiting layer 101c may realize threshold suppression to prevent high kinking, suppressing the substrate 100 mode, preventing the optical field modes from leading to the substrate 100 to form the standing waves, and making the output main laser beams free of ripples, thereby improving the quality of the laser light output from the semiconductor laser.

In some embodiments, a material of the first sub-limiting layer 101a and a material of the second sub-limiting layer 101c may include AlGaN. A material of the substrate mode suppression layer 101b may include any one of AlInGaN, InGaN, AlInN, and AlGaN, or any combination thereof.

In some embodiments, a thickness of the first sub-limiting layer 101a, a thickness of the substrate mode suppression layer 101b, and a thickness of the second sub-limiting layer 101c may be within a first preset range of thickness, respectively. The thickness of the first sub-limiting layer 101a, the thickness of the substrate mode suppression layer 101b, and the thickness of the second sub-limiting layer 101c may be the same or different. The first preset range of thickness may be determined in various ways, such as by manual experience or historical data of the semiconductor laser.

In some embodiments, the thickness of the first sub-limiting layer 101a, the thickness of the substrate mode suppression layer 101b, and the thickness of the second sub-limiting layer 101c may be within a range of 10-90000 Å. Merely by way of example, the thickness of the first sub-limiting layer 101a may be 10 Å, 300 Å, 7000 Å, or 90000 Å; the thickness of the substrate mode suppression layer 101b may be 10 Å, 400 Å, 8000 Å, or 90000 Å; and the thickness of the second sub-limiting layer 101c may be 10 Å, 500 Å, 5000 Å, or 90000 Å.

In some embodiment of the present disclosure, by designing the materials and the thicknesses of the first sub-limiting layer 101a, the substrate mode suppression layer 101b, and the second sub-limiting layer 101c, the substrate 100 mode can be suppressed and the optical field modes can be prevented from leading to the substrate 100 to form the standing waves. In addition, the need for a thickness of a first limiting layer can also be satisfied, reducing a refractive index of the limiting layer, thereby improving the quality of the laser light output from the semiconductor laser.

The basic concept has been described above. Obviously, for those skilled in the art, the above detailed disclosure is only an example, and does not constitute a limitation to the present disclosure. Although not expressly stated here, those skilled in the art may make various modifications, improvements and corrections to the present disclosure. Such modifications, improvements and corrections are suggested in this disclosure, so such modifications, improvements and corrections still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that references to "one embodiment" or "an embodiment" or "an alternative embodiment" two or more times in different places in the present disclosure do not necessarily refer to the same embodiment. In addition, certain features, structures, or characteristics in one or more embodiments of the present disclosure may be properly combined.

In addition, unless clearly stated in the claims, the sequence of processing elements and sequences described in the present disclosure, the use of counts and letters, or the use of other names are not used to limit the sequence of processes and methods in the present disclosure. While the foregoing disclosure has discussed by way of various examples some embodiments of the invention that are presently believed to be useful, it should be understood that such detail is for illustrative purposes only and that the appended claims are not limited to the disclosed embodiments, but rather, the claims are intended to cover all modifications and equivalent combinations that fall within the spirit and scope of the embodiments of the present disclosure. For example, although the implementation of various components described above may be embodied in a hardware device, it may also be implemented as a software only solution, e.g., an installation on an existing server or mobile device.

In the same way, it should be noted that in order to simplify the expression disclosed in this disclosure and help the understanding of one or more embodiments of the invention, in the foregoing description of the embodiments of the present disclosure, sometimes multiple features are combined into one embodiment, drawings or descriptions thereof. This method of disclosure does not, however, imply that the subject matter of the disclosure requires more features than are recited in the claims. Rather, claimed subject matter may lie in less than all features of a single foregoing disclosed embodiment.

In some embodiments, counts describing the quantity of components and attributes are used. It should be understood that such counts used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the disclosure and claims are approximations that can vary depending upon the desired characteristics of individual embodiments. In some embodiments, numerical parameters should consider the specified significant digits and adopt the general digit retention method. Although the numerical ranges and parameters used in some embodiments of the present disclosure to confirm the breadth of the range are approximations, in specific embodiments, such numerical values are set as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A semiconductor laser with a substrate mode suppression layer, comprising a substrate, a first limiting layer, a first waveguide layer, an active layer, a second waveguide layer, an electron blocking layer, and a second limiting layer sequentially stacked from bottom to top, wherein the first limiting layer includes a first sub-limiting layer, the substrate mode suppression layer, and a second sub-limiting layer sequentially stacked from bottom to top;

a Si/C concentration ratio of an element Si to an element C of the substrate mode suppression layer is greater than or equal to a Si/C concentration ratio of an element Si to an element C of the first sub-limiting layer, and the Si/C concentration ratio of the element Si to the element C of the first sub-limiting layer is greater than or equal to a Si/C concentration ratio of an element Si to an element C of the second sub-limiting layer; the Si/C concentration ratio of the element Si to the element C of the substrate mode suppression layer is within a range of 200-8000;

an In/Al concentration ratio of an element In to an element Al of the substrate mode suppression layer is greater than or equal to an In/Al concentration ratio of an element In to an element Al of the first sub-limiting layer, and the In/Al concentration ratio of the element In to the element Al of the first sub-limiting layer is greater than or equal to an In/Al concentration ratio of an element In to an element Al of the second sub-limiting layer; and an H/C concentration ratio of an element H to an element C of the substrate mode suppression layer is greater than or equal to an H/C concentration ratio of an element H to an element C of the second sub-limiting layer, and the H/C concentration ratio of the element H to the element C of the second sub-limiting layer is greater than or equal to an H/C concentration ratio of an element H to an element C of the first sub-limiting layer.

2. The semiconductor laser of claim 1, wherein at least one substrate mode suppression layer is provided between the first sub-limiting layer and the second sub-limiting layer.

3. The semiconductor laser of claim 1, wherein the Si/C concentration ratio of the element Si to the element C of the first sub-limiting layer is within a range of 80-200.

4. The semiconductor laser of claim 1, wherein the Si/C concentration ratio of the element Si to the element C of the second sub-limiting layer is within a range of 5-80.

5. The semiconductor laser of claim 1, wherein a maximum value of a range of the In/Al concentration ratio of the element In to the element Al of the substrate mode suppression layer is more than 105 times a minimum value of a range of the In/Al concentration ratio of the element In to the element Al of the first sub-limiting layer.

6. The semiconductor laser of claim 1, wherein a maximum value of a range of the In/Al concentration ratio of the element In to the element Al of the substrate mode suppression layer is more than 105 times a minimum value of a range of the In/Al concentration ratio of the element In to the element Al of the second sub-limiting layer.

7. The semiconductor laser of claim 1, wherein a material of the first sub-limiting layer and a material of the second sub-limiting layer include AlGaN, and a thickness of the first sub-limiting layer and a thickness of the second sub-limiting layer are within a range of 10-90000 Å; and a material of the substrate mode suppression layer includes any one of AlInGaN, InGaN, AlInN, and AlGaN, or any combination thereof, and a thickness of the substrate mode suppression layer is within a range of 10-90000 Å.

8. The semiconductor laser of claim 1, wherein the active layer includes a periodic structure consisting of well layers and barrier layers, and a period m of the periodic structure is within a range of $1 \leq m \leq 3$; a material of each of the well layers of the active layer includes any one of GaN, InGaN, InN, AlInN, AlInGaN, and AlGaN, or any combination thereof, and a thickness p of each of the well layers of the active layer is within a range of $5 \leq p \leq 100$ Å; a material of each of the barrier layers of the active layer includes any one of GaN, InGaN, InN, AlInN, AlInGaN, and AlN, or any combination thereof, and a thickness q of each of the barrier layers of the active layer is within a range of $10 \leq q \leq 200$ Å; a thickness x of the first waveguide layer is within a range of $10 \leq x \leq 9000$ Å; a thickness y of the second waveguide layer is within a range of $10 \leq y \leq 9000$ Å; a thickness l of the second limiting layer is within a range of $10 \leq l \leq 80000$ Å; and a thickness n of the electron blocking layer is within a range of $10 \leq n \leq 80000$ Å.

9. The semiconductor laser of claim 1, wherein a material of the first waveguide layer, a material of the second waveguide layer, a material of the electron blocking layer, and a material of the second limiting layer include any one of GaN, AlGaN, InGaN, AlInGaN, AlN, InN, AlInN, SiC, Ga2O3, BN, GaAs, GaP, InP, AlGaAs, AlInGaAs, AlGaInP, InGaAs, AlInAs, AlInP, AlGaP, and InGaP, or any combination thereof; and a material of the substrate includes any one of a sapphire, Si, Ge, SiC, AlN, GaN, GaAs, InP, a sapphire/SiO2 composite substrate, a sapphire/AlN composite substrate, sapphire/SiNx, magnesium aluminum spinel MgAl2O4, MgO, ZnO, ZrB2, LiAlO2, and a LiGaO2 composite substrate, or any combination thereof.

* * * * *